United States Patent
Choi et al.

(10) Patent No.: US 8,435,881 B2
(45) Date of Patent: May 7, 2013

(54) SEMICONDUCTOR DEVICE AND METHOD OF FORMING PROTECTIVE COATING OVER INTERCONNECT STRUCTURE TO INHIBIT SURFACE OXIDATION

(75) Inventors: Won Kyoung Choi, Singapore (SG); Pandi Chelvam Marimuthu, Singapore (SG)

(73) Assignee: STAT ChipPAC, Ltd., Singapore (SG)

( * ) Notice: Subject to any disclaimer, the term of this patent is extended or adjusted under 35 U.S.C. 154(b) by 0 days.

(21) Appl. No.: 13/167,566

(22) Filed: Jun. 23, 2011

(65) Prior Publication Data
US 2012/0326297 A1    Dec. 27, 2012

(51) Int. Cl.
H01L 21/283    (2006.01)

(52) U.S. Cl.
USPC .......................... 438/612; 438/614

(58) Field of Classification Search .................. 438/597, 438/612, 613; 257/E21.589
See application file for complete search history.

(56) References Cited

U.S. PATENT DOCUMENTS

| | | | |
|---|---|---|---|
| 3,761,309 A * | 9/1973 | D.Schmitter, et al. | ........ 428/600 |
| 6,080,497 A | 6/2000 | Carey, II et al. | |
| 8,232,193 B2 * | 7/2012 | Chang | ............................ 438/613 |
| 2002/0173073 A1 | 11/2002 | Liang et al. | |
| 2009/0102032 A1 | 4/2009 | Schnegans et al. | |
| 2009/0127708 A1 * | 5/2009 | Lee et al. | ........................ 257/737 |
| 2009/0233436 A1 | 9/2009 | Kim et al. | |
| 2009/0267213 A1 * | 10/2009 | Lin et al. | ........................ 257/687 |
| 2011/0086505 A1 * | 4/2011 | Yu | .................................. 438/614 |
| 2011/0101520 A1 * | 5/2011 | Liu et al. | ........................ 257/737 |
| 2011/0101523 A1 * | 5/2011 | Hwang et al. | ................. 257/737 |
| 2011/0260317 A1 * | 10/2011 | Lu et al. | ........................ 257/737 |

* cited by examiner

*Primary Examiner* — Alexander Ghyka
*Assistant Examiner* — Stanetta Isaac
(74) *Attorney, Agent, or Firm* — Robert D. Atkins; Patent Law Group: Atkins & Associates, P.C.

(57) ABSTRACT

A semiconductor device has a semiconductor die with a first conductive layer formed over the semiconductor die. A first insulating layer is formed over the semiconductor die with a first opening in the first insulating layer disposed over the first conductive layer. A second conductive layer is formed over the first insulating layer and into the first opening over the first conductive layer. An interconnect structure is formed over the first and second conductive layers within openings of a second insulating layer. The second insulating layer is removed. The interconnect structure can be a conductive pillar or conductive pad. A bump material can be formed over the conductive pillar. A protective coating is formed over the conductive pillar or pad to a thickness less than one micrometer to reduce oxidation. The protective coating is formed by immersing the conductive pillar or pad into the bath containing tin or indium.

30 Claims, 13 Drawing Sheets

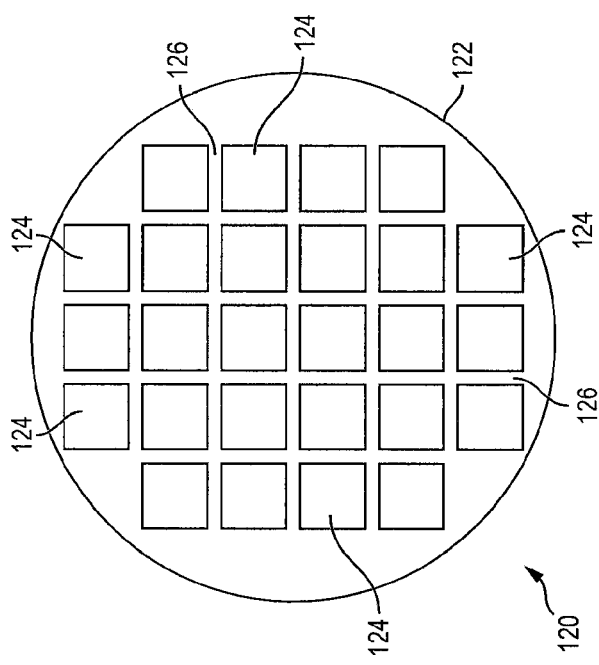
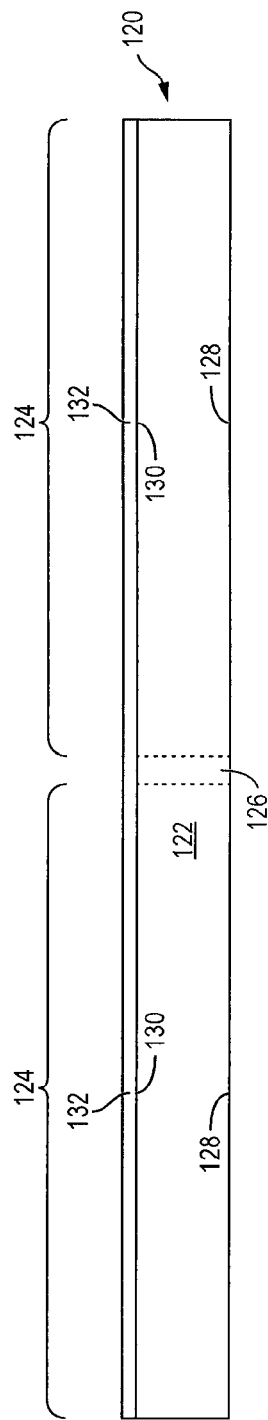
FIG. 3a
FIG. 3b

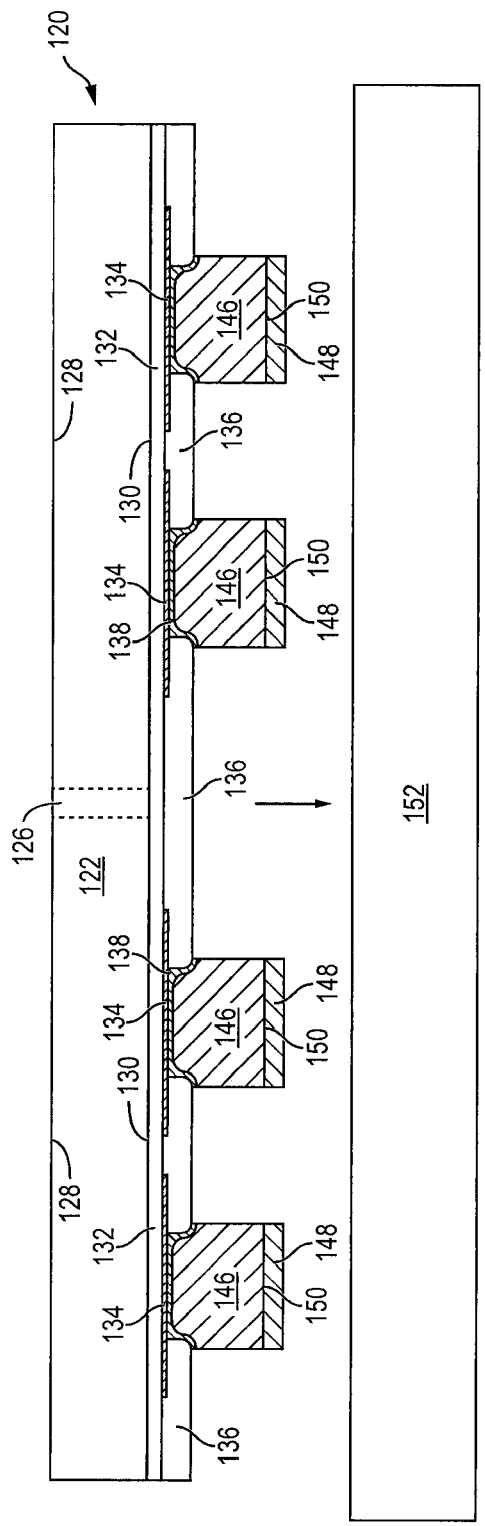
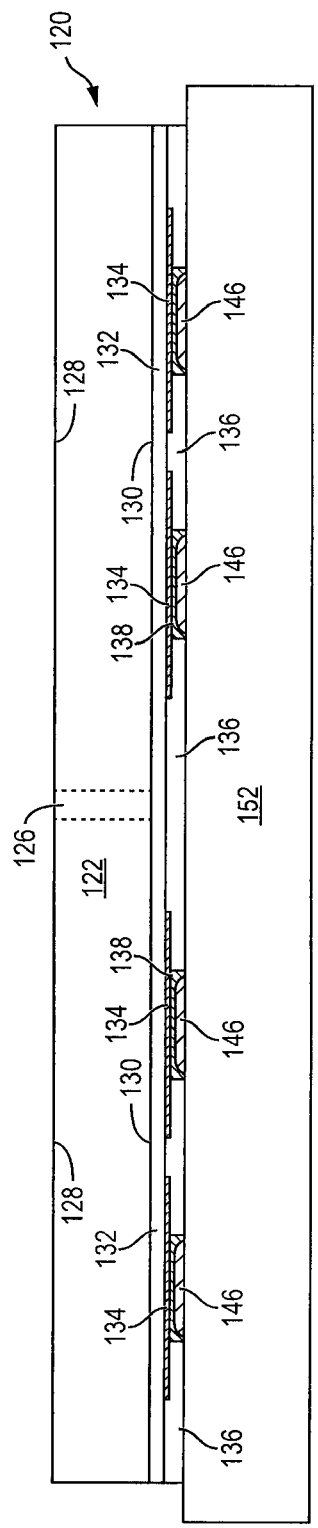

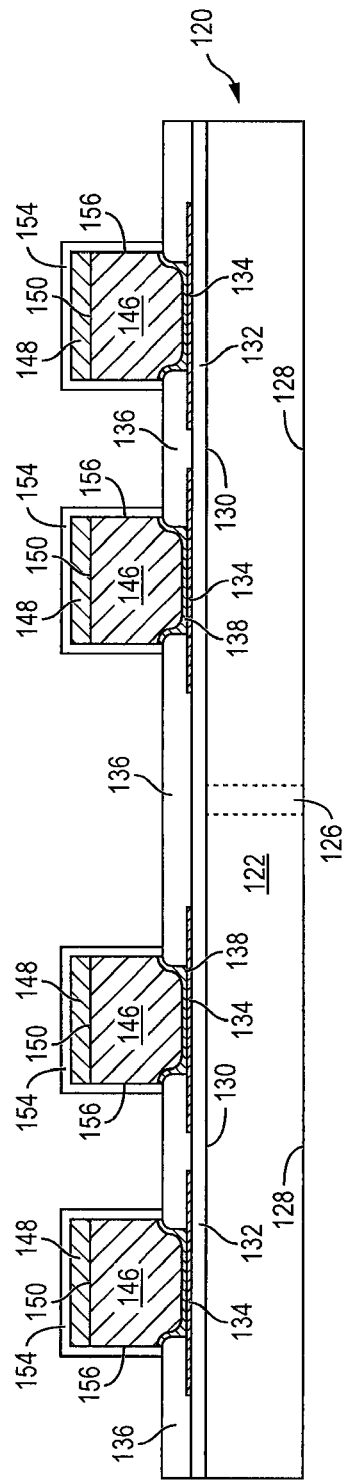
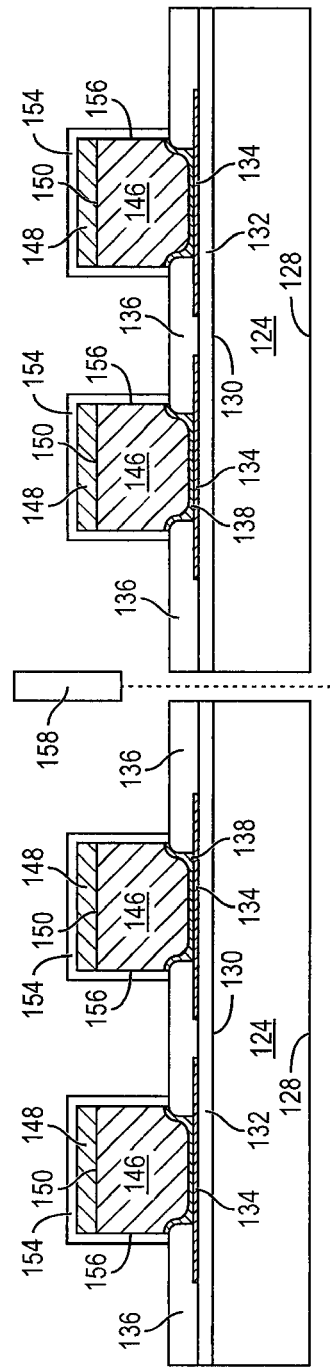

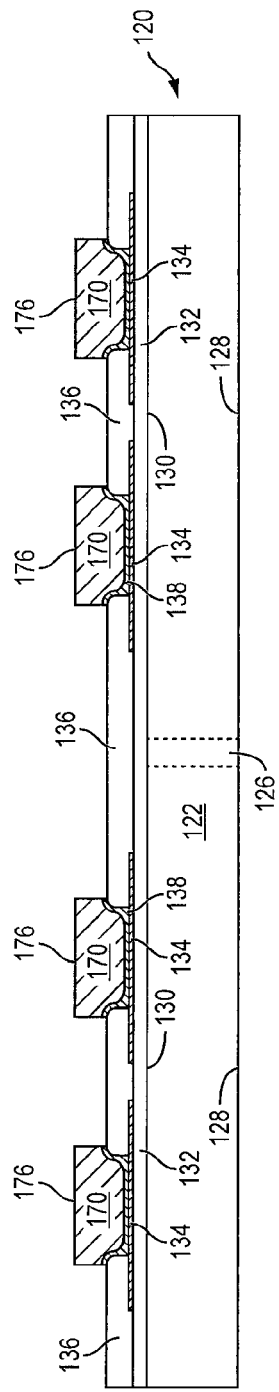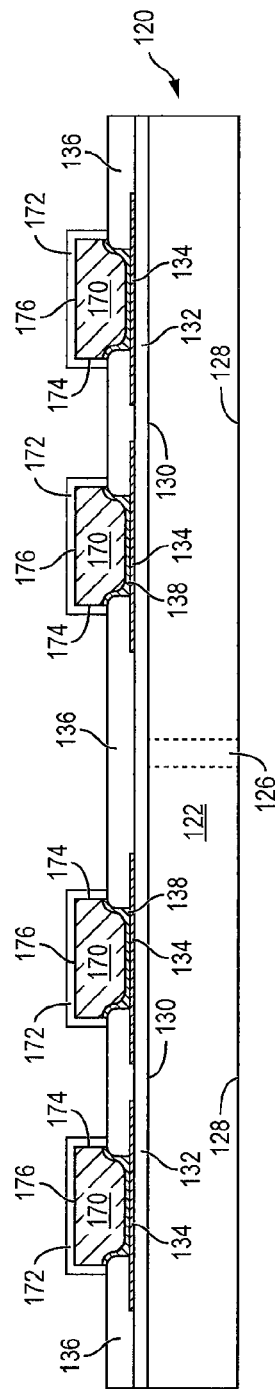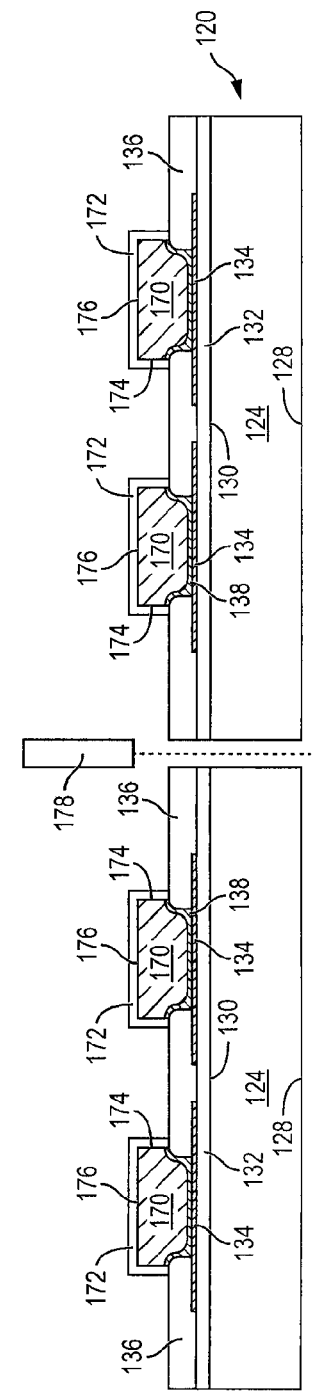

SEMICONDUCTOR DEVICE AND METHOD OF FORMING PROTECTIVE COATING OVER INTERCONNECT STRUCTURE TO INHIBIT SURFACE OXIDATION

FIELD OF THE INVENTION

The present invention relates in general to semiconductor devices and, more particularly, to a semiconductor device and method of forming a protective coating over an interconnect structure to inhibit surface oxidation and corrosion.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A semiconductor die typically contains an interconnect structure for mounting the die to a substrate. For example, the interconnect structure can be a bump or conductive pillar with bump cap formed over contact pads within an opening in an insulating layer on the semiconductor die. The bump or conductive pillar with bump cap is bonded to the substrate by reflowing the bump material to provide mechanical and electrical interconnect between the semiconductor die and substrate. Conductive pillars offer the advantage of smaller interconnect pitches and higher interconnect and routing density.

The sidewalls of the conductive pillars, particularly Cu pillars, are subject to surface oxidation and corrosion. The surface oxidation can adversely affect bonding and joint reliability, leading to reduced manufacturing yield and higher cost.

SUMMARY OF THE INVENTION

A need exists to form an interconnect structure, such as a conductive pillar, while inhibiting surface oxidation and corrosion. Accordingly, in one embodiment, the present invention is a method of making a semiconductor device comprising the steps of providing a semiconductor wafer, forming a first conductive layer over the semiconductor wafer, forming a first insulating layer over the semiconductor wafer with a first opening in the first insulating layer disposed over the first conductive layer, forming a second conductive layer over the first insulating layer and into the first opening over the first conductive layer, forming a conductive pillar over the first and second conductive layers, and forming a protective coating over the conductive pillar to reduce oxidation.

In another embodiment, the present invention is a method of making a semiconductor device comprising the steps of providing a semiconductor wafer, forming a first insulating layer over the semiconductor wafer, forming a first conductive layer over the first insulating layer, forming an interconnect structure over the first conductive layer, and forming a protective coating over the interconnect structure to reduce oxidation.

In another embodiment, the present invention is a method of making a semiconductor device comprising the steps of providing a semiconductor die, forming a first conductive layer over the semiconductor die, forming an interconnect structure over the first conductive layer, and forming a protective coating over the interconnect structure to reduce oxidation.

In another embodiment, the present invention is a semiconductor device comprising a semiconductor die and first conductive layer formed over the semiconductor die. A first insulating layer is formed over the semiconductor die with a first opening in the first insulating layer disposed over the first conductive layer. A second conductive layer is formed over the first insulating layer and into the first opening over the first conductive layer. An interconnect structure is formed over the first and second conductive layers. A protective coating is formed over the interconnect structure to reduce oxidation.

BRIEF DESCRIPTION OF THE DRAWINGS

FIGS. 5a-5f illustrate a process of forming a protective coating over conductive pads to inhibit surface oxidation and corrosion.

DETAILED DESCRIPTION OF THE DRAWINGS

Figure 1:
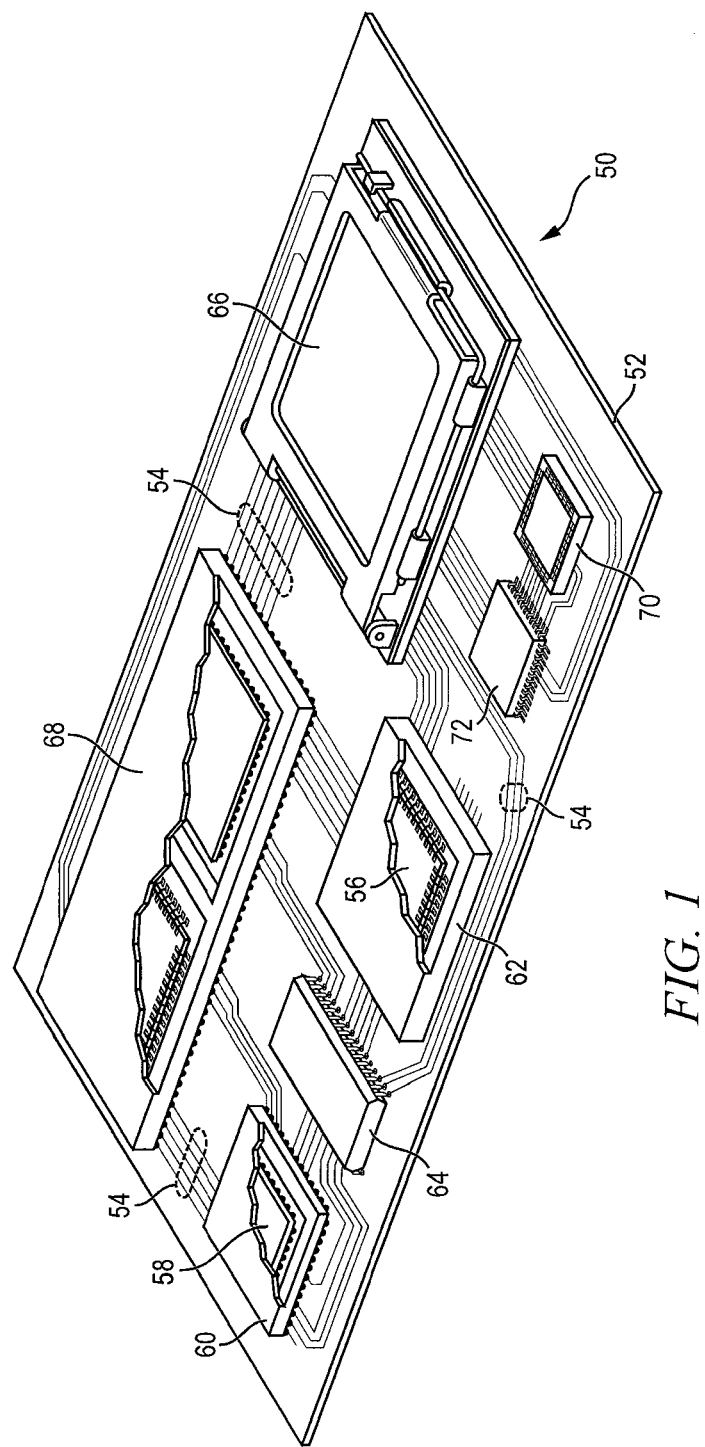
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
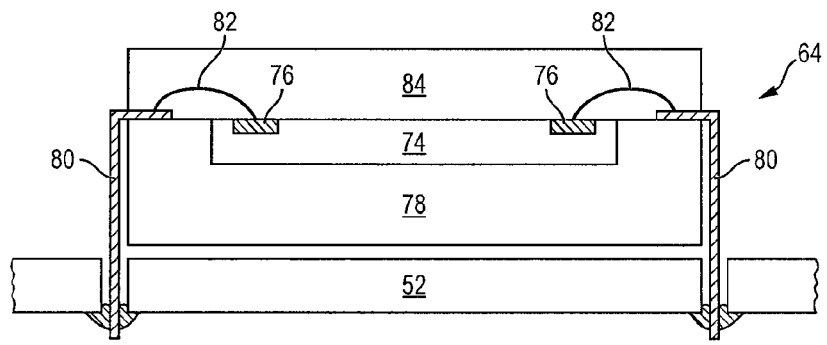
FIGS. 2a-2c illustrate further detail of the representative semiconductor packages mounted to the PCB.
Figure 2B:
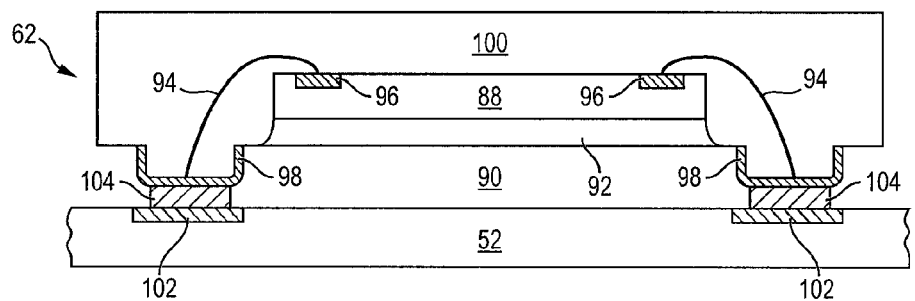
Figure 2C:
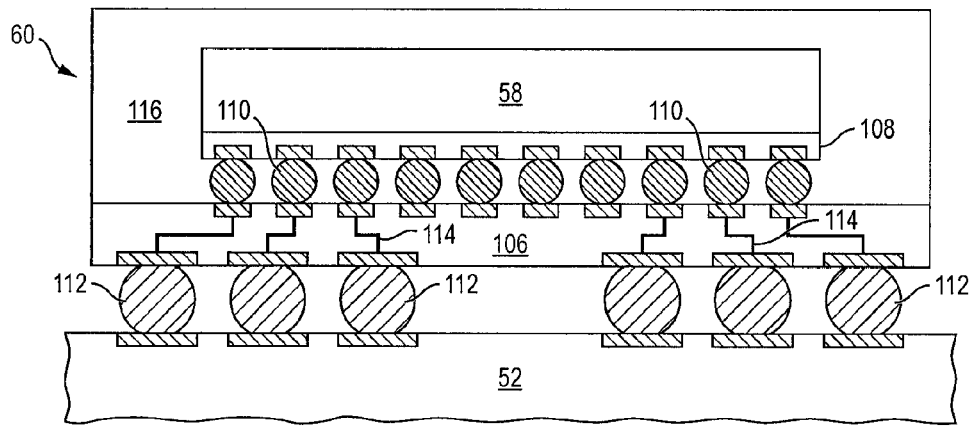

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted to carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

FIGS. 3a-3p illustrate, in relation to FIGS. 1 and 2a-2c, a process of forming a protective coating over conductive pillars and bump material to inhibit surface oxidation and corrosion. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An insulating or dielectric layer 132 is formed over active surface 130 using PVD, CVD, printing, spin coating, spray coating, sintering or thermal oxidation. The insulating layer 132 contains one or more layers of silicon dioxide (SiO2), silicon nitride (Si3N4), silicon oxynitride (SiON), tantalum pentoxide (Ta2O5), aluminum oxide (Al2O3), benzocyclobutene (BCB), polyimide (PI), polybenzoxazoles (PBO), or other suitable dielectric material.

Figure 3C:
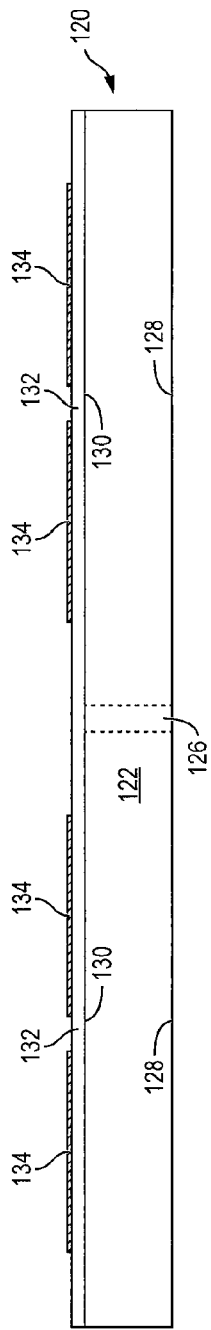
FIGS. 3a-3p illustrate a process of forming a protective coating over conductive pillars and bump material to inhibit surface oxidation and corrosion.

In FIG. 3c, an electrically conductive layer 134 is formed over insulating layer 132 using PVD, CVD, electrolytic plating, electroless plating process, or other suitable metal deposition process. Conductive layer 134 can be one or more layers of Al, Cu, Sn, Ni, Au, Ag, or other suitable electrically conductive material. Conductive layer 134 operates as contact pads electrically connected to the circuits on active surface 130, e.g., through conductive vias formed through insulating layer 132.

Figure 3D:
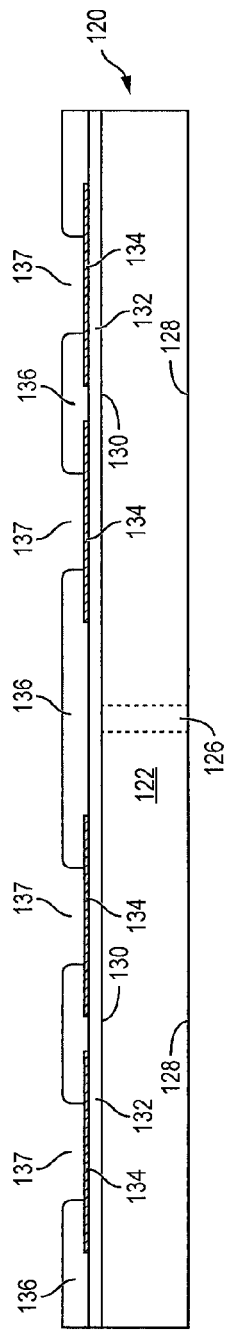

In FIG. 3d, an insulating or passivation layer 136 is formed over insulating layer 132 and conductive layer 134 using PVD, CVD, printing, spin coating, spray coating, sintering or thermal oxidation. The insulating layer 136 contains one or more layers of SiO2, Si3N4, SiON, Ta2O5, Al2O3, or other material having similar insulating and structural properties. A portion of insulating layer 136 is removed by an etching process to form openings 137 disposed over and exposing conductive layer 134.

Figure 3E:
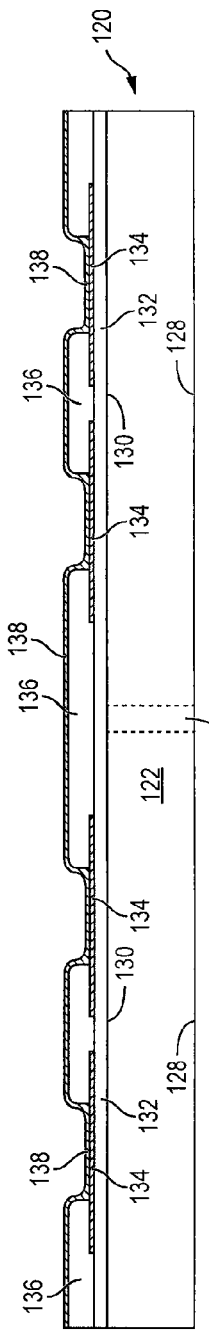

In FIG. 3e, an electrically conductive layer 138 is conformally applied over conductive layer 134 and insulating layer 136 using PVD, CVD, electrolytic plating, electroless plating process, or other suitable metal deposition process. Conductive layer 138 can be one or more layers of Al, Cu, titanium (Ti), Sn, Ni, Au, Ag, or other suitable electrically conductive material. Conductive layer 138 follows the contour of conductive layer 134 and insulation layer 136. In one embodiment, conductive layer 138 is a seed layer containing multiple layers of Ti/Cu or Ti/Au and electrically connected to conductive layer 134.

Figure 3F:
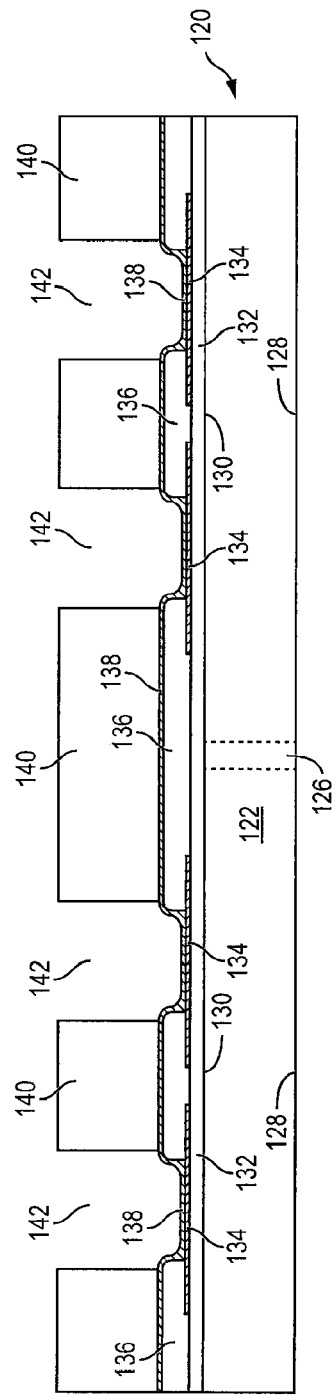

In FIG. 3f, a thick insulating layer 140 is formed over insulating layer 136 and conductive layer 138. The insulating layer 140 can contain one or more layers of SiO2, Si3N4, SiON, Ta2O5, Al2O3, solder resist, or other photo-sensitive material formed by PVD, CVD, printing, spin coating, spray coating, sintering or thermal oxidation. A portion of insulating layer 140 is removed by patterning, exposure to UV light, and developing to form openings 142 and expose a portion of conductive layer 138 disposed over conductive layer 134.

Figure 3G:
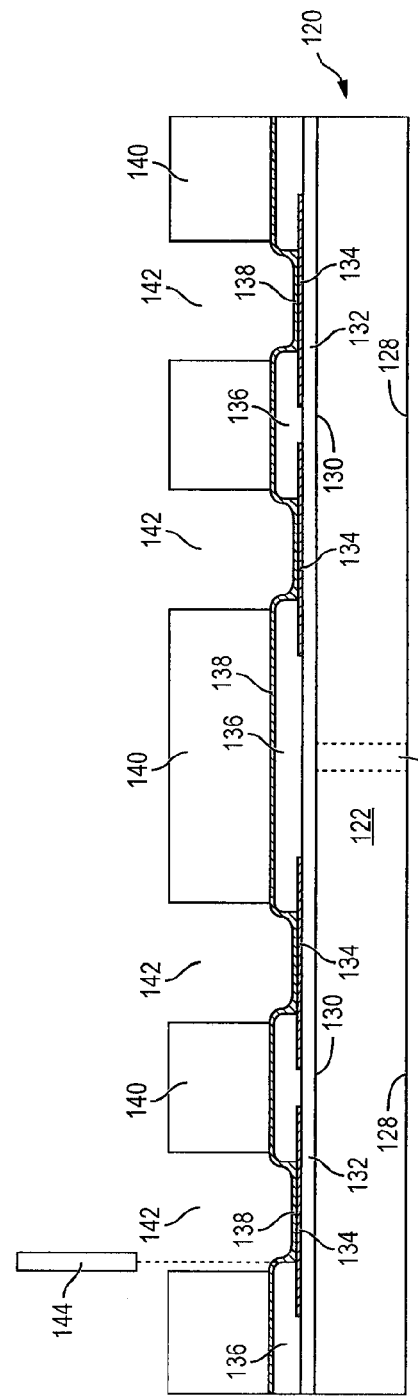

In another embodiment, insulating layer 140 is a dry-film material with a PET support film. The dry film material is patterned and irradiated. A portion of insulating layer 140 is removed by subjecting the irradiated DFR material to a developer which selectively dissolves non-irradiated portions of the DFR material to create patterned openings 142 in insulating layer 140 disposed over conductive layers 134 and 138, while leaving the irradiated portions of the photoresist material intact. Alternatively, patterned openings 142 can be formed by laser direct ablation (LDA) using laser 144 to remove portions of insulating layer 140 and expose conductive layer 138 in applications requiring finer interconnect dimensions, as shown in FIG. 3g.

Figure 3H:
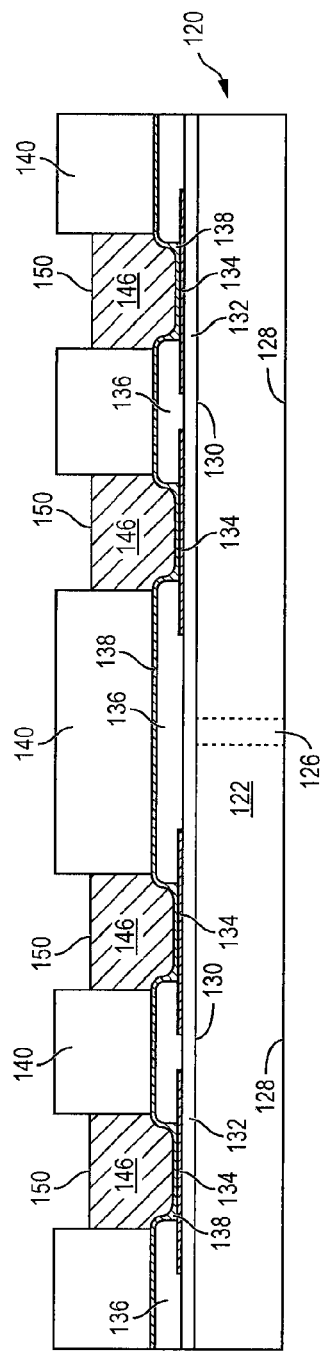

In FIG. 3h, an electrically conductive material is deposited within patterned openings 142 using a metal deposition process such as PVD, CVD, sputtering, electrolytic plating, and electroless plating. The conductive material can be multiple layers of Al, palladium (Pd), Cu, Sn, Ni, Au, or Ag. The conductive material partially fills patterned openings 142 to form cylindrical conductive pillars 146 as an interconnect structure for semiconductor die 124. In one embodiment, conductive pillars 146 have a height of 50 micrometers (μm). Conductive pillars 146 are electrically connected to conductive layers 134 and 138.

Figure 3I:
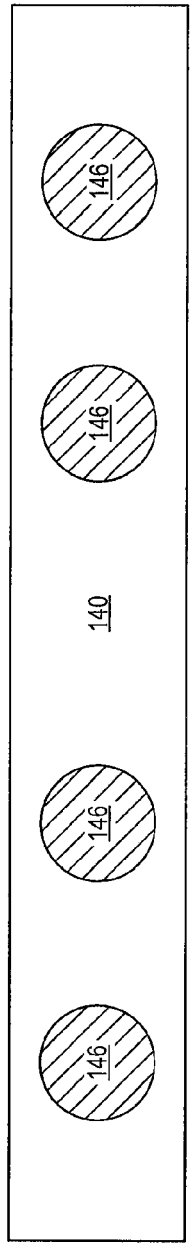

FIG. 3i shows a top view of insulating layer 140 and cylindrical conductive pillars 146 formed within patterned openings 142.

Figure 3J:
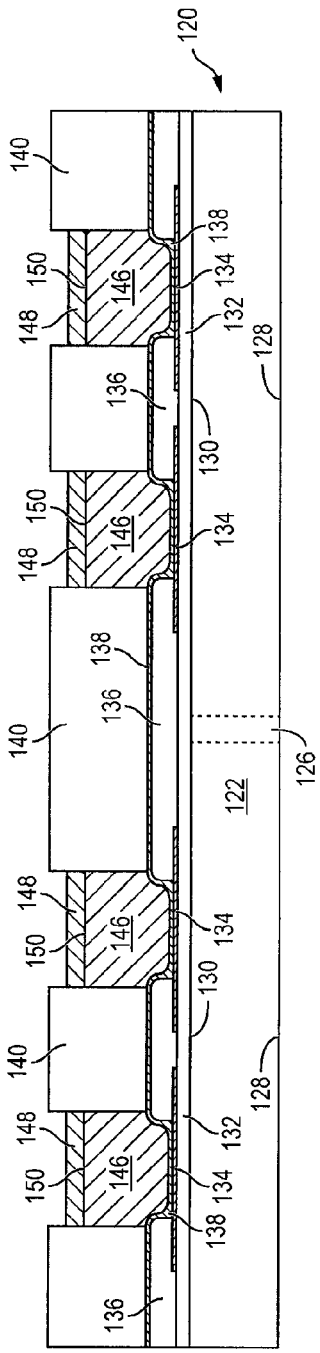

In FIG. 3j, an electrically conductive bump material 148 is deposited over surface 150 of conductive pillars 146 within patterned openings 142 using an evaporation, electrolytic plating, electroless plating, ball drop, or screen printing process. Bump material 148 can be Al, Sn, Ni, Au, Ag, Pb, Bi, Cu, solder, and combinations thereof, with an optional flux solution. For example, bump material 148 can be eutectic Sn/Pb, high-lead solder, or lead-free solder. Bump material 148 is bonded to surface 150 of conductive pillars 132 using a suitable attachment or bonding process.

Figure 3K:
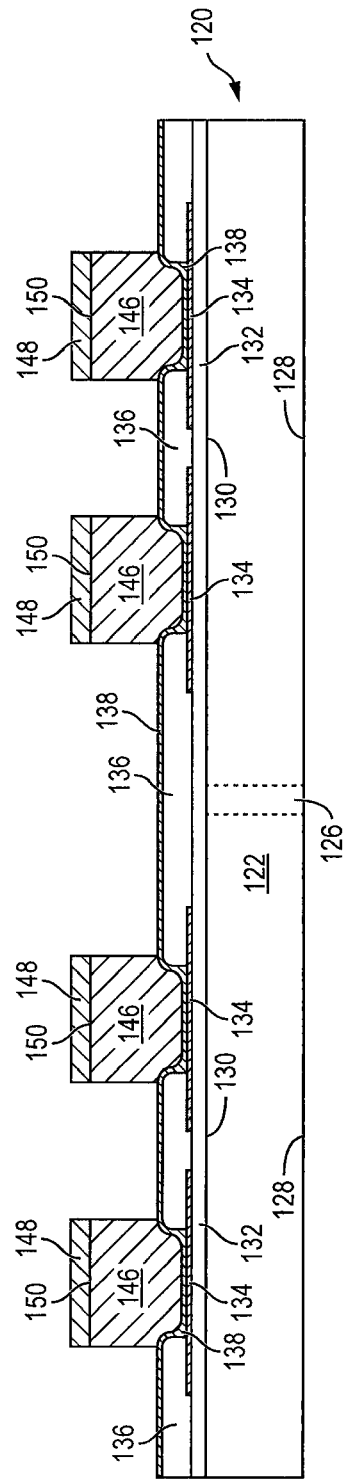
Figure 3L:
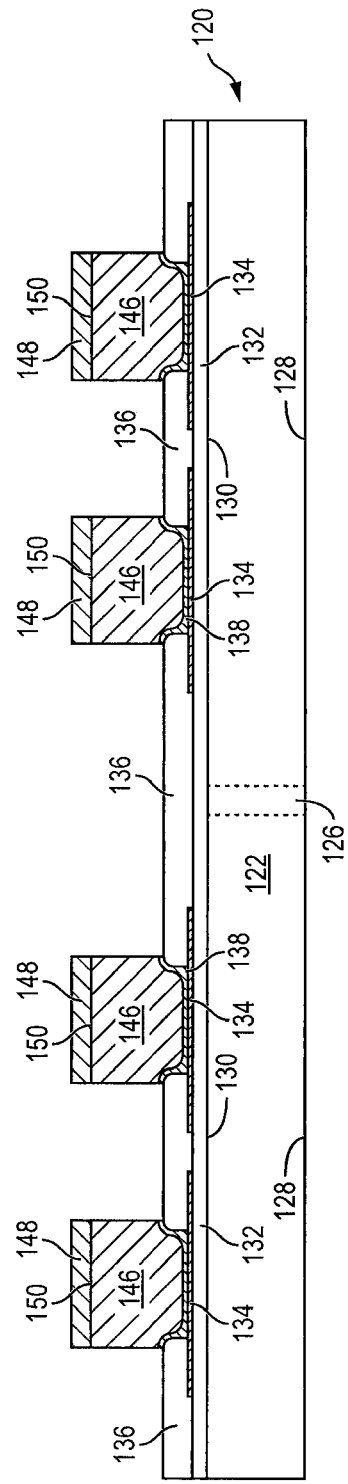

In FIG. 3k, insulating layer 140 is removed, leaving cylindrical conductive pillars 146 and bump material 148 disposed over conductive layers 134 and 138. In FIG. 3l, the portion of conductive layer 138 over insulating layer 136, i.e., outside openings 137, is removed by a wet etching process.

In FIG. 3m, leading with conductive pillars 146 and bump material 148, semiconductor wafer 120 is positioned over bath 152 containing Sn or indium (In). FIG. 3n shows conductive pillars 146 and bump material 148 of semiconductor wafer 120 immersed in bath 152. The immersion forms a protective coating 154 over surface 156 of conductive pillars 146 and bump material 148, as well as other exposed conductive layers on semiconductor wafer 120, as shown in FIG. 3o. The protective coating 154 contains Sn or In to protect surface 156 of conductive pillars 146, as well as other exposed conductive layers on semiconductor wafer 120, against oxidation. Protective coating 154 is particularly useful for Cu conductive pillars. In one embodiment, protective coating 154 has a thickness of less than 1.0 μm.

In FIG. 3p, semiconductor wafer 120 is singulated through saw street 126 using a saw blade or laser cutting tool 158 into individual semiconductor die 124.

Figure 4A:
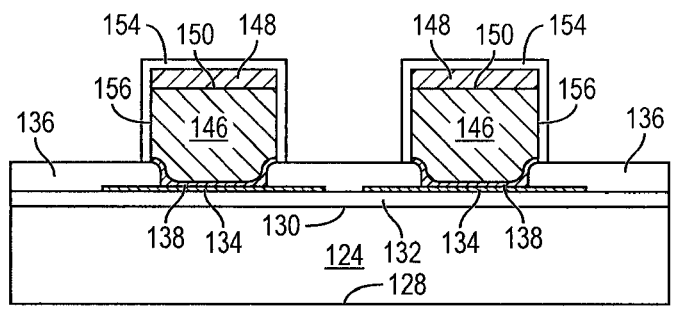
FIGS. 4a-4c illustrate the semiconductor die having a protective coating formed over the conductive pillars mounted to a substrate.

FIG. 4a shows semiconductor die 124 with cylindrical conductive pillars 146 and bump material 148 covered by protective coating 154. Conductive pillars 146 have a fine pitch for high density interconnect. The protective coating 154 inhibits or reduces oxidation and corrosion on surface 156, conductive pillars 146 and bump material 148, as well as other exposed conductive layers on semiconductor die 124, which could adversely affect bonding and joint reliability. The protective coating 154 becomes an intermetallic coverage (IMC) layer at room temperature.

Figure 4B:
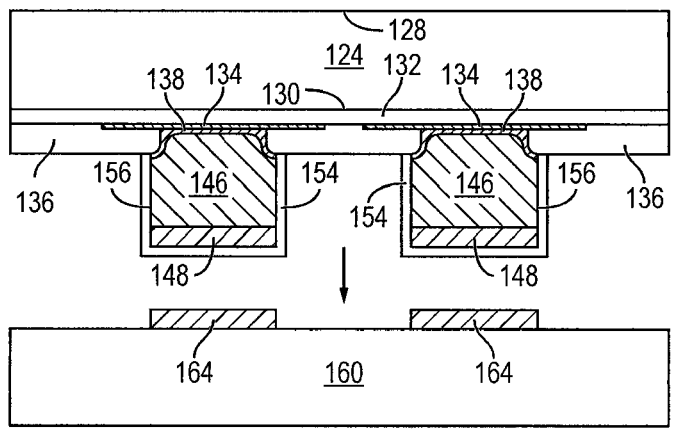
Figure 4C:
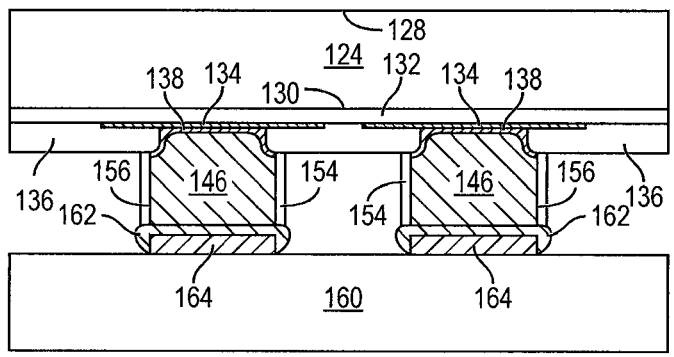

In FIG. 4b, semiconductor die 124 is positioned over substrate or PCB 160 with conductive pillars 146 aligned to conductive traces 164 formed on the substrate. FIG. 4c shows semiconductor die 124 mounted to substrate or PCB 160 with bump material 148 reflowed by heating the material above its melting point to form bumps 162 bonded to conductive traces 164 on the substrate. In some applications, bumps 162 are reflowed a second time to improve electrical connection between conductive pillars 146 and conductive traces 164. Bump material 148 can also be compression bonded to conductive traces 164.

Figure 5A:
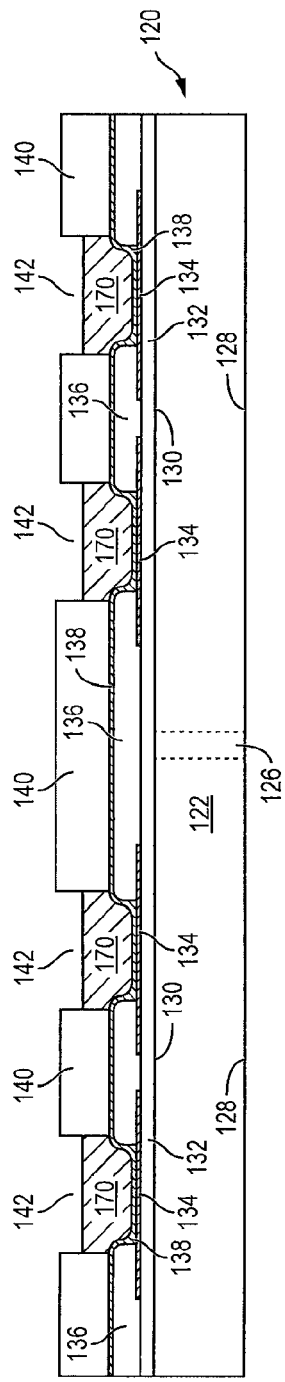

FIGS. 5a-5f illustrate, in relation to FIGS. 1 and 2a-2c, a process of forming a protective coating over conductive pads to inhibit surface oxidation and corrosion. Continuing from FIG. 3f, an electrically conductive material is deposited within patterned openings 142 using a metal deposition process such as PVD, CVD, sputtering, electrolytic plating, and electroless plating, as shown in FIG. 5a. The conductive material can be multiple layers of Al, palladium (Pd), Cu, Sn, Ni, Au, or Ag. The conductive material partially fills patterned openings 142 to form cylindrical conductive pads 170 as an interconnect structure for semiconductor die 124. In one embodiment, conductive pads 170 have a height of 25-30 μm. Conductive pads 170 are electrically connected to conductive layers 134 and 138.

Figure 5B:
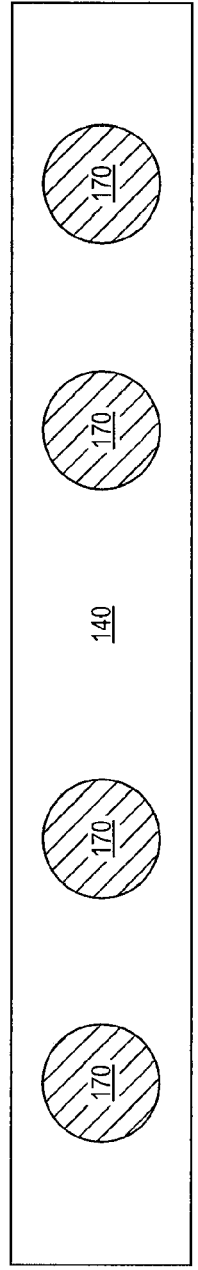

FIG. 5b shows a top view of insulating layer 140 and cylindrical conductive pads 170 formed within patterned openings 142.

Figure 5C:
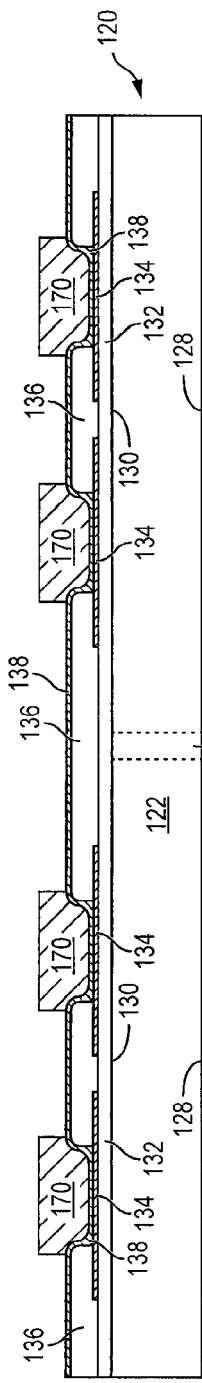

In FIG. 5c, insulating layer 140 is removed, leaving cylindrical conductive pads 170 disposed over conductive layers 134 and 138. In FIG. 5d, the portion of conductive layer 138 over insulating layer 136, i.e., outside openings 137, is removed by a wet etching process.

Leading with conductive pads 170, semiconductor wafer 120 is immersed in a bath containing Sn or In, similar to FIGS. 3m and 3n. The immersion forms a protective coating 172 over surfaces 174 and 176 of conductive pads 170, as well as other exposed conductive layers on semiconductor wafer 120, as shown in FIG. 5e. The protective coating 172 contains Sn or In to protect surfaces 174 and 176 of conductive pads 170, as well as other exposed conductive layers on semiconductor wafer 120, against oxidation, particularly for Cu conductive pads. In one embodiment, protective coating 172 has a thickness of less than 1.0 μm.

In FIG. 5f, semiconductor wafer 120 is singulated through saw street 126 using a saw blade or laser cutting tool 178 into individual semiconductor die 124.

Figure 6:
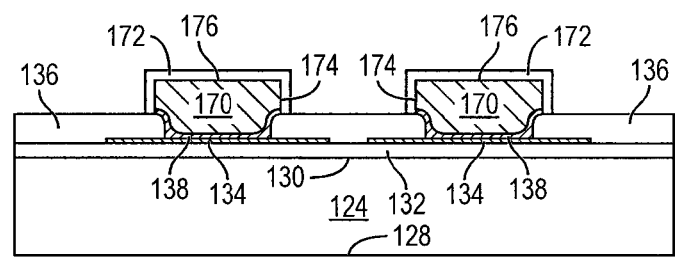
FIG. 6 illustrates the semiconductor die having a protective coating formed over the conductive pads.

FIG. 6 shows semiconductor die 124 with conductive pads 170 formed over conductive layers 134 and 138 and covered by protective coating 172. Conductive pads 170 have a fine pitch for high density interconnect. The protective coating 172 inhibits oxidation and corrosion on surfaces 174 and 176 of conductive pads 170, as well as other exposed conductive layers on semiconductor die 124, which could adversely affect bonding and joint reliability. The protective coating 172 becomes an IMC layer at room temperature.

While one or more embodiments of the present invention have been illustrated in detail, the skilled artisan will appreciate that modifications and adaptations to those embodiments may be made without departing from the scope of the present invention as set forth in the following claims.

The invention claimed is:

1. A method of making a semiconductor device, comprising:
   providing a semiconductor wafer;
   forming a first conductive layer over the semiconductor wafer;
   forming a first insulating layer over the semiconductor wafer including a first opening in the first insulating layer;
   forming a conductive pillar over the first conductive layer in the first opening in the first insulating layer;
   forming a reflowable bump over the conductive pillar; and
   forming a protective coating contacting a surface of the conductive pillar and a surface of the reflowable bump to reduce oxidation.

2. The method of claim 1, wherein forming the protective coating over the conductive pillar and reflowable bump includes:
   providing a bath of coating material; and
   immersing the conductive pillar and reflowable bump into the bath to deposit the coating material over the conductive pillar and reflowable bump.

3. The method of claim 1, wherein the protective coating includes tin or indium.

4. The method of claim 1, wherein the protective coating includes a thickness less than one micrometer.

5. The method of claim 1, wherein forming the conductive pillar includes:
   forming a second conductive layer over the first insulating layer and into the first opening of the first insulating layer;
   forming a second insulating layer over the first insulating layer including a second opening in the second insulating layer disposed over the first and second conductive layers;
   depositing a conductive material into the second opening of the second insulating layer to form the conductive pillar;
   removing the second insulating layer; and
   removing the second conductive layer over the first insulating layer outside a footprint of the conductive pillar.

6. A method of making a semiconductor device, comprising:
   providing a semiconductor wafer;
   forming a first insulating layer over the semiconductor wafer;
   forming an interconnect structure over the semiconductor wafer;
   forming a reflowable bump over the interconnect structure; and
   forming a protective coating contacting the interconnect structure and the reflowable bump to reduce oxidation.

7. The method of claim 6, wherein the interconnect structure includes a conductive pillar or conductive pad.

8. The method of claim 6, wherein forming the protective coating over the interconnect structure and reflowable bump includes:
   providing a bath of coating material; and
   immersing the interconnect structure and reflowable bump into the bath to deposit the coating material over the interconnect structure and reflowable bump.

9. The method of claim 6, wherein the protective coating includes tin or indium.

10. The method of claim 6, wherein the protective coating includes a thickness less than one micrometer.

11. The method of claim 6, wherein forming the interconnect structure includes:
    forming a first conductive layer over the first insulating layer;
    forming a second insulating layer over the first insulating layer including an opening in the second insulating layer disposed over the first conductive layer;
    depositing a conductive material into the opening of the second insulating layer to form the interconnect structure; and
    removing the second insulating layer.

12. The method of claim 11, further including forming the opening in the second insulating layer by laser direct ablation to expose the first conductive layer.

13. A method of making a semiconductor device, comprising:
    providing a semiconductor die;
    forming a first conductive layer over the semiconductor die;
    forming an interconnect structure over the first conductive layer;
    forming a bump material over the interconnect structure; and
    forming a protective coating contacting the interconnect structure and bump material to reduce oxidation.

14. The method of claim 13, wherein the interconnect structure includes a conductive pillar or conductive pad.

15. The method of claim 13, wherein forming the protective coating over the interconnect structure and bump material includes:
   providing a bath of coating material; and
   immersing the interconnect structure and bump material into the bath to deposit the coating material over the interconnect structure and bump material.

16. The method of claim 13, wherein the protective coating includes tin or indium.

17. The method of claim 13, wherein the protective coating includes a thickness less than one micrometer.

18. The method of claim 13, wherein forming the interconnect structure includes:
   forming an insulating layer over the semiconductor die including an opening in the insulating layer disposed over the first conductive layer;
   depositing a conductive material into the opening of the insulating layer to form the interconnect structure; and
   removing the insulating layer.

19. The method of claim 18, further including forming the opening in the insulating layer by laser direct ablation to expose the first conductive layer.

20. A method of making a semiconductor device, comprising:
   providing a semiconductor die;
   forming an interconnect structure over the semiconductor die;
   forming a bump material over the interconnect structure; and
   forming a protective coating contacting the interconnect structure and bump material.

21. The method of claim 20, wherein the interconnect structure includes a conductive pillar or conductive pad.

22. The method of claim 20, wherein forming the protective coating over the interconnect structure and bump material includes:
   providing a bath of coating material; and
   immersing the interconnect structure and bump material into the bath to deposit the coating material over the interconnect structure and bump material.

23. The method of claim 20, wherein the protective coating includes a thickness of less than one micrometer.

24. The method of claim 20, wherein the protective coating includes tin or indium.

25. The method of claim 20, wherein the protective coating forms an intermetallic cover over the interconnect structure and bump material.

26. A method of making a semiconductor device, comprising:
   providing a semiconductor die including an interconnect structure;
   forming a bump material over the interconnect structure; and
   forming a protective coating contacting the interconnect structure and bump material.

27. The method of claim 26, wherein the interconnect structure includes a conductive pillar or conductive pad.

28. The method of claim 26, wherein the protective coating includes a thickness of less than one micrometer.

29. The method of claim 26, wherein the protective coating includes tin or indium.

30. The method of claim 26, wherein the protective coating forms an intermetallic cover over the interconnect structure and bump material.

* * * * *